United States Patent [19]

Kitamoto et al.

[11] 4,412,507
[45] Nov. 1, 1983

[54] MAGNETIC RECORDING MEDIUM MANUFACTURING DEVICE

[75] Inventors: Tatsuji Kitamoto; Ryuji Shirahata, both of Kanagawa, Japan

[73] Assignee: Fuji Photo Film Co., Ltd., Kanagawa, Japan

[21] Appl. No.: 284,863

[22] Filed: Jul. 20, 1981

[30] Foreign Application Priority Data

Aug. 14, 1980 [JP] Japan .................................. 55-112084

[51] Int. Cl.³ ............................................ B05C 11/14
[52] U.S. Cl. ...................................... 118/718; 118/50;
118/500; 118/504; 118/621; 118/623; 118/729
[58] Field of Search ................ 427/132; 118/718, 729,
118/50, 504, 500, 621, 623

[56] References Cited
U.S. PATENT DOCUMENTS 3,342,632 9/1967 Bate et al. ........................ 427/55 X
4,220,117 9/1980 Shinohara ........................... 118/718

Primary Examiner—Bernard D. Pianalto
Attorney, Agent, or Firm—Sughrue, Mion, Zinn, Macpeak & Seas

[57] ABSTRACT

A magnetic recording medium manufacturing device in which a flexible belt-shaped support is conveyed above a molten metal vaporizing source substantially at a constant speed while a magnetic film is formed on a surface of the support by vacuum deposition. The support is guided by transporting means such that the support is curved above the molten metal vaporizing source along a path wherein metal vapor flow lines connecting the center of the molten metal vaporizing source to points on the surface of the support form a constant angle of incidence with the longitudinal direction of the support. An adjusting mechanism is provided to change the angle of incidence by moving the transporting means along lines parallel to the metal vapor flow lines.

9 Claims, 6 Drawing Figures

MAGNETIC RECORDING MEDIUM MANUFACTURING DEVICE

BACKGROUND OF THE INVENTION

The present invention relates to a so-called "oblique incidence vacuum deposition" device in which a magnetic material is applied by vacuum deposition obliquely to a flexible belt-shaped support being continuously conveyed to thereby manufacture a magnetic recording material.

Recently, as the demand for high-density magnetic recording has increased, instead of the conventional magnetic recording medium manufacturing method in which a binder type magnetic lacquer is coated on a flexible support and dried, a variety of non-coating type magnetic recording medium manufacturing methods in which, without using a binder, a ferromagnetic metal film layer is formed on a support by vacuum deposition, sputtering, ion plating, or the like have become of increased interest.

Among the non-coating magnetic recording medium manufacturing methods, an oblique incidence vacuum deposition method in which beams of evaporated magnetic metal are applied obliquely to the surface of a support so as to be deposited thereon has been found to be quite practical because the process is simple and the apparatus needed for implementing the method is relatively compact. Moreover, the method provides a magnetic film layer having excellent magnetic characteristics.

A special feature of the conventional oblique incidence vacuum deposition is that, while the support is being conveyed straightly or along the outer wall of a cylindrical drum, i.e. along a curved line, above the evaporating source, a ferromagnetic metal film is vacuum-deposited in one step on the support surface to a predetermined thickness by the evaporated metal beam from the evaporating source with the application (incident) angle of the beam being strictly limited. However, as the evaporated beam is oblique with respect to the support surface, the thickness of the vacuum-deposited metal film is equal to the cosine of the angle of incidence multiplied by the thickness of a vacuum-deposited metal film which would be formed with a zero incidence angle (where the evaporated metal beam forms a right angle with the support surface). Therefore, it is unavoidable that as the incident angle is increased, the efficiency of vacuum deposition is decreased. In addition, if the geometrical arrangement of the support and the evaporating source is such that the incident angle is increased, then the distance between the support and the evaporating source is correspondingly increased, and accordingly the efficiency of vacuum deposition is further decreased. Since the magnetic characteristics of the vacuum-deposited magnetic film depend on the incident angle (see, for example, Japanese Published Patent Application No. 352,558 - 1964), it is essential that the incident angle be as small as possible and that it be maintained unchanged during coating operations.

A low efficiency of vacuum deposition makes it difficult to decrease the manufacturing cost when a relatively expensive nonferrous metal such as cobalt or cobalt alloy is used. Accordingly, this has been a serious problem requiring solution before the method can be put to practical use.

In order to solve the problem, for instance, as proposed in Japanese Laid-Open Patent Application No. 9607/1979, a method can be used in which the evaporating source is shifted from the position immediately below the drum so that only a high-density portion of the evaporated metal beam is applied to the surface of the support on the outer wall of the drum. Using this method, the efficiency of vacuum deposition is 20%.

However, with this method, it is difficult to increase the range of suitable evaporated metal beam incident angles with respect to the support on the outer wall of the drum. Accordingly, further improvement of the efficiency of vacuum deposition for a given evaporating source is limited. Further, the method must be greatly improved if the efficiency of vacuum deposition is to be made satisfactory. The method is also disadvantageous in that the resultant magnetic recording medium does not have uniform magnetic characteristics if an incident angle larger than a particular angle is used.

SUMMARY OF THE INVENTION

Accordingly, an object of the present invention is to provide a magnetic recording medium manufacturing device in which the above-described problems of vacuum deposition efficiency accompanying a conventional oblique incidence vacuum deposition method are eliminated, and with which a magnetic recording medium having a high magnetic intensity and rectangular hysteresis ratio can be manufactured.

The foregoing object and other objects of the invention have been achieved by the provision of a magnetic recording medium manufacturing device in which, while a flexible belt-shaped support is conveyed above a molten metal vaporizing source substantially at a constant speed, a magnetic film is formed on the surface of the support by vacuum deposition, wherein, according to the invention, curve forming means is provided for guiding the support in such a way that the support is curved above the molten metal vaporizing source in such a manner that a metal vapor flow line connecting the center of a molten metal vaporizing surface to a point on the surface of the support forms the same incident angle with the longitudinal direction of the support at all times.

DESCRIPTION OF THE PREFERRED EMBODIMENTS

Figure 1:
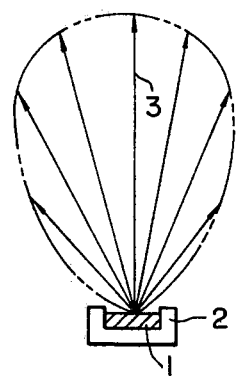
FIG. 1 is an explanatory diagram for a description of metal vapor flows in a magnetic recording medium manufacturing device constructed according to the invention.
Figure 2:
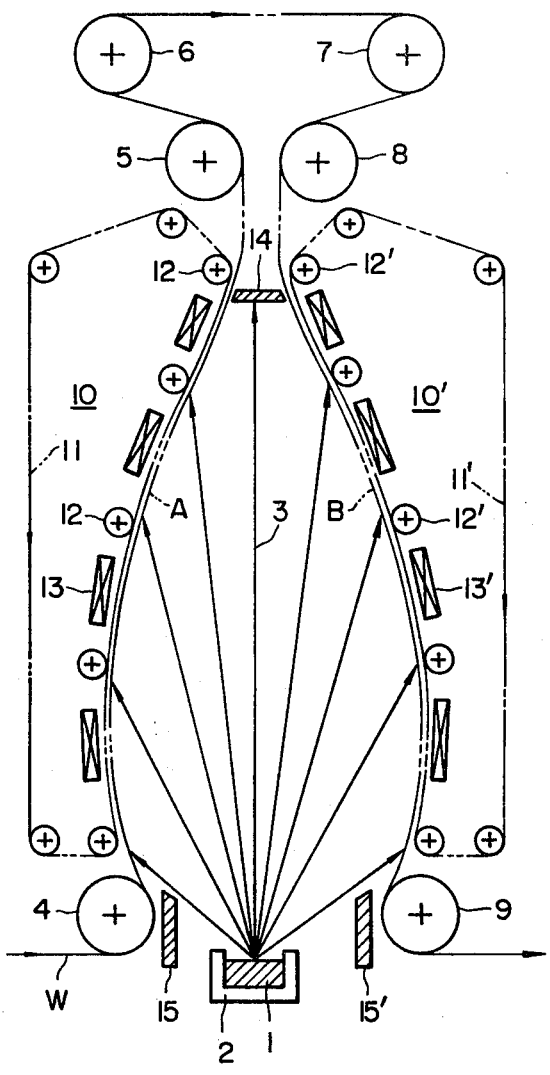
FIG. 2 is a schematic diagram showing the essential components of the device of the invention.

FIGS. 1 and 2 show an apparatus for manufacturing a magnetic recording medium to which the invention is applied. In FIG. 1, reference numeral 1 designates a supply of evaporated metal which is provided by scanning an electron beam onto a metal in a water-cooling copper hearth 2 which extends in the widthwise direction of a flexible belt-shaped support, web W. The metal vapor 1 diffuses and evaporates along evaporated metal flow lines as indicated by arrows 3 in FIG. 1. While the web W is being guided in such a manner as to form a curved loop above the hearth 2, a metal film layer is formed on the lower surface, facing the hearth 2, of the web W.

A structure for guiding the web W along the curved loop is shown in FIG. 2. Guide rollers 4 through 9 are provided at points where the direction of run of the web W is to be changed with the guide rollers 4 through 9 directly supporting the web W. Among the guide rollers, the rollers 4 and 5 and the rollers 8 and 9 form a rising path A of the web W and a falling pathe B of the web W, respectively, which are symmetrical with respect to the hearth 2. Endless belt-shaped curved forming mechanisms 10 and 10' are provided between the rollers 4 and 5 and between the rollers 8 and 9, respectively.

The curve forming mechanisms 10 and 10' have endless belts 11 and 11', respectively, each of which is formed as follows: Metal such as copper or aluminum is vacuum-deposited on the outer side of a plastic belt, on the inner side of which an iron film, a fine iron wire or iron powder is provided. The endless belts 11 and 11' thus formed are laid over a plurality of guide rollers 12 and 12', respectively. A plurality of magnets 13 and 13' are suitably disposed adjacent to the inner sides of portions of the endless belts 11 and 11' forming the above-described rising path A and falling path B of the web W, respectively. The magnets 13 and 13' continuously attract the endless belts 11 and 11' so that the belts curve along the rising path A and the falling path B, respectively. Each of the endless belts 11 and 11' may be replaced by a caterpillar-type belt which is provided by connecting a number of elongated iron plates.

The web W running along the curved rising path A and the curved falling path B is electrostatically charged by a glow discharge process or the like before it confronts the hearth 2. Therefore, the web W is electrostatically attracted to the outer sides of the endless belts 11 and 11' in the rising path A and the falling path B so that it is guided in the form of a curve.

Figure 3:
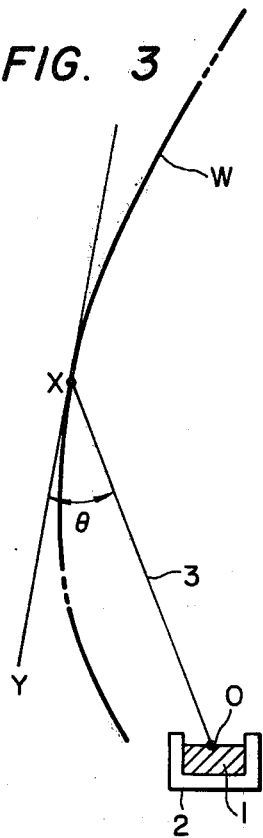
FIG. 3 is an enlarged view showing relationships between a metal vapor flow line and a curved web in FIG. 2.

The shape of the curve forming mechanisms 10 and 10' is determined as follows. As shown in FIG. 3, the evaporated metal flow line 3 connecting central point O of the evaporation surface of the metal vapor 1 to a given point X on the web W along the rising path A (or the falling path B) forms an angle <YXO with a line XY tangent to the point X. The curve forming mechanism is so designed that it conveys the web W with a curvature so as to maintain the angle <YXO constant in the longitudinal direction of the web W.

In the regions where the lower portions of the rising path A and the falling path B are located and the two paths A and B come closest to each other, it is desirable that shielding masks 15 and 15' be provided between the hearth 2 and the guide roller 4 and between the hearth 2 and the guide roller 9, respectively, and that a shielding mask 14 be disposed between the guide rollers 5 and 8 in order to eliminate difficulties in deposition quality which can be caused if the density of evaporated metal flow lines of the evaporated metal 1 is considerably too small or in areas where it is difficult to curve the web W so that the above-described incident angle is maintained.

In the above-described device, while the web W is passing above the hearth 2 substantially at a constant speed, the web W is guided along the curves by the curve forming mechanisms 10 and 10' in such a manner that the evaporated metal flow lines connecting the central point O of the evaporation surface of the evaporated metal 1 in the hearth 2 to a given point on the web W form the same incident angle $\theta$ with respect to the longitudinal direction of the web W. With this construction, the efficiency of vacuum-deposition of the evaporated metal 1 is greatly improved and the resultant magnetic characteristic is uniform.

In order to confirm the efficiency of vacuum-deposition according to the device of the invention, first utilizing only the rising path A in FIG. 2, cobalt was vacuum-deposited on a conveyed polyester film of thickness 12 $\mu$m, and second utilizing both the rising path A and the falling path B, cobalt was vacuum-evaporated on the same film. In the former case, the efficiency of vacuum-deposition was 25% while in the latter case it was 52%.

The magnetic characteristics of a vacuum-deposited cobalt film formed according to a method proposed by Japanese Laid-Open Patent Application No. 9607/1979 among the above-described conventional methods, especially the coercive force and rectangular ratio thereof, were compared with those of a vacuum-deposited cobalt film formed according to the above-described method of the invention. The coercive force and the rectangular ratio of the film according to the conventional method were 850 Oe and 0.91, respectively, while those of the film according to the method of the invention were 900 Oe and 0.95. Thus, it has been confirmed that the device of the invention provides excellent magnetic characteristic.

The method of performing vacuum deposition by forming a running path with which the incident angle $\theta$ is maintained constant is advantageous as described above. In general, the incident angle $\theta$, indicated in FIG. 3, is closely dependent on the desired magnetic characteristics, especially coercive force. In general, the smaller the incident angle $\theta$, the higher the coercive force. Depending on the intended use of the magnetic recording media, that is, whether the magnetic recording media is to be used for recording audio signals or video signals, the vacuum-deposited magnetic layers for magnetically recording data require different coercive force, such as for instance 500 to 600 Oe, 1000 Oe and 1500 Oe.

Accordingly, it is desirable that in the oblique vacuum deposition device of the invention the aforementioned incident angle $\theta$ can readily be changed to thus readily set the running path in accordance with the desired magnetic characteristics.

Figure 4:
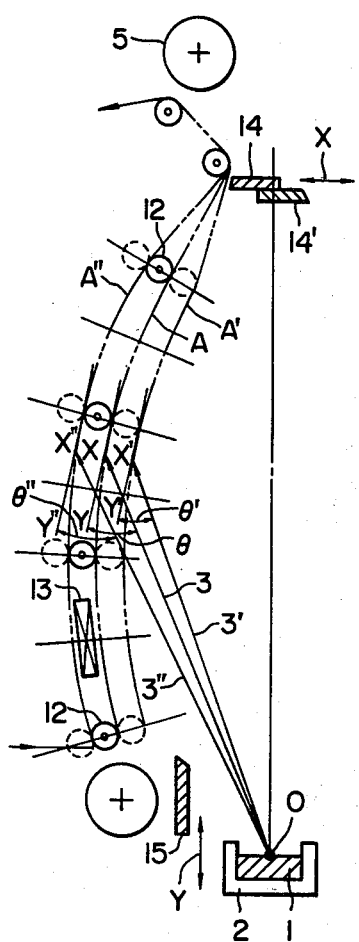
FIG. 4 is an explantory diagram showing a movable type curve forming mechanism.
Figure 5:
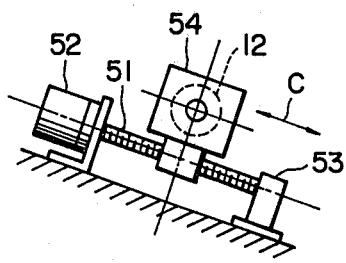
FIGS. 5 and 6 are side views of examples of a movable type supporting mechanism.
Figure 6:
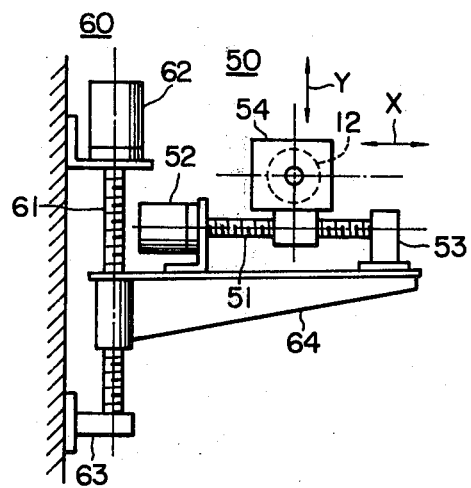

The employment of a movable type curve forming mechanism as shown in FIGS. 4 through 6 makes it possible to set the curvature of the aforementioned rising path A or falling path B as desired. In FIG. 4, the guide rollers 12 and the magnets 13 forming the rising path A are supported in such a manner that they are movable to the right or left along axes C which intersect the curve center point (not shown in FIG. 4) of the rising path A.

FIG. 5 is a side view of a movable supporting mechanism 50 which supports both ends of the guide roller 12 and which is capable of moving the guide roller 12 along the axis C. The mechanism 50 includes a threaded shaft 51 arranged parallel to the axis C, an electric motor 52 coupled to one end of the threaded shaft 51 to turn the shaft 51, a bearing 53 supporting the other end of the threaded shaft 51, and a movable bearing 54 which is supported by the threaded shaft 51 and which passes through the bearing 54. A print motor, a stepping motor or an actuator may selectively be employed as the motor 52 according to the movement control accuracy.

When the motor 52 is driven to turn the threaded shaft 51 in one direction or in the opposite direction, the movable bearing 54 is moved in either direction of the arrow C, and accordingly the guide roller 12 supported by the bearing 54 is moved in the same direction. The movement distance and speed of the guide roller 12 can be controlled with ordinary detection and control devices such as limit switches, a magnetic sensor and a pulse oscillator. Similarly as for the guide rollers, each magnet 13 disposed between adjacent guide rollers 12 can be moved and controlled by a movable supporting mechanism similar to that shown in FIG. 5.

Accordingly, when it is required to change the incident angle $\theta$ to different angles $\theta'$ and $\theta''$ as shown in FIG. 4, the rising path A can be freely changed to a rising path A' or A'', respectively.

In setting the rising path A, A' or A'', it is desirable to move the masks 14 and 15 in the direction of the arrows X and Y to suitable positions so that the unwanted metal vapor flows are blocked thereby.

If the aforementioned falling path B is provided symmetrically with the rising path A, the mask 14 can be used to affect both of the paths A and B. A second mask 14' can be positioned below the mask 14 so as to be movable with respect to the falling path B. Alternatively, the mask 14 and 14' and the masks 15 and 15' may be supported rockably so as to make it possible to thus vary the metal vapor flow blocking regions with respect to the paths A and B.

FIG. 6 shows a modification of the above-described movable supporting mechanism 50. The above-described movable type supporting mechanism 50 is mounted on a vertical movement mechanism 60 which includes a threaded shaft 61 arranged vertically, an electric motor 62, a bearing 63, and a bracket 64 which is threadably engaged with the threaded shaft 61 to be movable vertically (in the direction of the arrow X). With this mechanism, the guide roller 12 can be moved both vertically (X) and horizontally (Y) simultaneously by turning both of the threaded shafts 51 and 61 in one direction and/or in the opposite direction.

In manufacturing a magnetic recording medium according to the vacuum deposition device of the invention, metal such as Fe, Co or Ni may be employed as a ferromagnetic metal to form a magnetic film, or ferromagnetic alloys such as Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr, or Fe-Co-Ni-Cr may be employed. The magnetic film should be thick enough to provide a sufficient output as a magnetic recording medium and thin enough for high density recording operations. Taking these consideration into account, in general, the thickness of the magnetic film should be in a range of from about 0.02 $\mu$m to 5.0 $\mu$m, preferably from 0.05 $\mu$m to 2.0 $\mu$m.

A plastic base support, for instance, of polyethylene terephthalate, polyimide, polyamide, polyvinyl chloride, cellulose triacetate, policarbonate or polyethylene naphthalate may be employed as the support W.

A resistance heating method, a laser beam heating method, a high frequency heating method or an electron beam heating method can be employed to heat the evaporation source in accordance with the invention. A method of feeding a linear material to the heating source may be employed to feed the evaporation material.

An apparatus for practicing the method of the invention has been described with reference to the case where both the rising path A and the falling path B are used simultaneously. However, if necessary, only one of the two paths A and B can be used.

What is claimed is:

1. A magnetic recording medium manufacturing device comprising: a molten metal evaporating source; and means for transporting a flexible belt-shaped support above said evaporating source along a curved path formed such that all evaporated metal flow lines originating from a central point on an evaporation surface of said molten metal and contacting points on a line of said support which extends over a longitudinal length of said support where said evaporated metal flow lines contact said support from a substantially constant angle of incidence with respect to tangent lines formed at respective contact points of said support line, said tangent lines extending along a longitudinal direction of said support; and means for adjusting the position of said transporting means to vary said angle of incidence.

2. The magnetic recording medium manufacturing device of claim 1 wherein said support line has a concave shape when viewed from said central point on said evaporation surface of said molten metal.

3. The magnetic recording medium manufacturing device of claim 1 wherein said adjusting means comprises means for moving said transporting means along lines substantially parallel to said evaporated metal flow lines.

4. The magnetic recording medium manufacturing device of claim 3 wherein said adjusting means further comprises means for moving said transporting means along lines perpendicular to said evaporated metal flow lines.

5. The magnetic recording medium manufacturing device of claims 3 wherein said transporting means comprises a plurality of guide rollers and a plurality of magnets disposed along rising and falling paths of said support, and wherein said adjusting means comprises a plurality of threaded shafts having a longitudinal axis parallel to said evaporated metal flow lines and a plurality of movable bearings, each of said movable bearings being threadedly mounted on one of said threaded shafts, each of said movable bearings supporting a corresponding one of said magnets and said guide rollers.

6. The magnetic recording medium manufacturing device of claim 5 further comprising a plurality of brackets, one of said first-mentioned threaded shafts being rotatably mounted on a corresponding one of said brackets; and a plurality of second threaded shafts disposed perpendicularly to corresponding ones of said first-mentioned threaded shafts, said brackets being threadedly mounted on corresponding ones of said second threaded shaft.

7. The magnetic recording medium manufacturing device of claim 1 further comprising masks for blocking unwanted metal vapor flow lines arranged above and below said curved path.

8. The magnetic recording medium manufacturing device of claim 1 further comprising masks for blocking unwanted metal vapor flow lines arranged above and below said curved path, wherein said masks are mounted to be movable along straight lines.

9. The magnetic recording medium manufacturing device of claim 1 further comprising masks for blocking unwanted metal vapor flow lines arranged above and below said curved path, wherein said masks are rockably mounted.

* * * * *